(12) United States Patent
Oh

(10) Patent No.: US 8,723,228 B1
(45) Date of Patent: May 13, 2014

(54) POWER SEMICONDUCTOR DEVICE

(71) Applicant: LG Innotek Co., Ltd., Seoul (KR)

(72) Inventor: Jung Hun Oh, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/796,688

(22) Filed: Mar. 12, 2013

(30) Foreign Application Priority Data

Nov. 8, 2012 (KR) .......................... 10-2012-0125842

(51) Int. Cl.
*H01L 31/0328* (2006.01)
*H01L 31/0336* (2006.01)
*H01L 31/072* (2012.01)
*H01L 31/109* (2006.01)

(52) U.S. Cl.
USPC .................................. 257/194; 257/E29.246

(58) Field of Classification Search
CPC ............ H01L 29/66462; H01L 29/778; H01L 21/28247; H01L 29/8128
USPC ....................................................... 257/194
See application file for complete search history.

(56) References Cited

U.S. PATENT DOCUMENTS

| 8,134,182 B2 * | 3/2012 | Nomoto ......................... 257/194 |
| 8,304,811 B2 * | 11/2012 | Zhang ............................ 257/194 |
| 2012/0056191 A1 * | 3/2012 | Endo et al. ....................... 257/76 |
| 2012/0146097 A1 * | 6/2012 | Endo et al. ..................... 257/194 |

* cited by examiner

*Primary Examiner* — Thien F Tran
(74) *Attorney, Agent, or Firm* — Birch, Stewart, Kolasch & Birch, LLP

(57) ABSTRACT

A power semiconductor device is disclosed. The power semiconductor device includes a substrate, a first semiconductor layer disposed on the substrate, a second semiconductor layer disposed on the first semiconductor layer, a third semiconductor layer disposed on the second semiconductor layer and exposing a portion of the second semiconductor layer, a gate electrode disposed on the portion of the second semiconductor layer exposed via the third semiconductor layer, and a source electrode and a drain electrode disposed on the third semiconductor layer at both sides of the gate electrode to be spaced apart from each other. An electrical segregation region is formed in the third semiconductor layer between the gate electrode and the drain electrode.

20 Claims, 13 Drawing Sheets

POWER SEMICONDUCTOR DEVICE

CROSS REFERENCE TO RELATED APPLICATION

This application claims priority under 35 U.S.C. §119 to Korean Patent Application No. 10-2012-0125842, filed in Korea on Nov. 8, 2012, which is hereby incorporated in its entirety by reference as if fully set forth herein.

TECHNICAL FIELD

Embodiments relate to a power semiconductor device.

BACKGROUND

Power semiconductor devices are classified into Schottky barrier diodes, metal semiconductor field effect transistors, and high electron mobility transistors (HEMTs).

An HEMT is widely used due to excellent electron mobility and low noise characteristics thereof as an integrated circuit device operating at ultra high frequencies up to millimeter wave frequencies. As application systems employing HEMTs become more complex and elaborate, characteristics, particularly, radio frequency (RF) characteristics of HEMTs need to be improved.

Maximum oscillation frequency ($F_{max}$) is a very important factor to evaluate RF characteristics of the HEMT. The maximum oscillation frequency ($F_{max}$) may be improved by adjusting small-signal parameters and improving DC characteristics. There are a lot of other variables affecting the DC characteristics and small-signal parameters of the HEMT. Among these, a gate-recess structure, as the most important factor, will be described hereinafter.

FIG. 1 is a side view, in section, schematically illustrating a conventional HEMT device 1A having a first gate-recess structure with a wide recess region where a gate electrode is disposed. FIG. 2 is a side view, in section, schematically illustrating a conventional HEMT device 1B having a second gate-recess structure with a narrow recess region where a gate electrode is disposed.

Referring to FIGS. 1 and 2, each of the conventional HEMT devices 1A and 1B includes a substrate 10, a buffer layer 20 disposed on the substrate 10, a barrier layer 30 disposed on the buffer layer 20, and a cap layer 40 disposed on the barrier layer 3.

The conventional HEMT devices 1A and 1B respectively include recess regions $R_1$ and $R_2$ formed by partially removing the cap layer 40 to expose the barrier layer 30. A gate electrode 53 is disposed in each of the recess regions $R_1$ and $R_2$, and a source electrode 51 and a drain electrode 52 are disposed on the cap layer 40.

The HEMT device 1A illustrated in FIG. 1 has the first gate-recess structure with a wide recess region formed by partially removing the cap layer 40 except for regions on which the source electrode 51 and the drain electrode 52 are disposed. The HEMT device 1B illustrated in FIG. 2 has the second gate-recess structure with a narrow recess region formed by partially removing the cap layer 40 only at a region where the gate electrode 53 will be formed.

The HEMT device 1B having the second gate-recess structure has higher maximum drain current ($I_{dss,max}$) and higher maximum transconductance ($G_{m,max}$) than the HEMT device 1A having the first gate-recess structure. This is because in the HEMT device 1A having the first gate-recess structure, a free surface state 40a (marked with x) formed on the surface of the barrier layer 30 exposed by the recess region $R_1$ exhibits a negatively charged surface state to change the field in a channel 21, thereby reducing sheet carrier density ($n_s$).

Meanwhile, RF characteristics of the HEMT device 1B having the second gate-recess structure have not been improved compared to those of the HEMT device 1A having the first gate-recess structure although the HEMT device 1B has excellent DC characteristics. This is because the cap layer 40 with conductivity is formed up to the vicinity of the gate electrode 53 in the HEMT device 1B having the second gate-recess structure to reduce a substantial distance between the gate electrode and the drain electrode, thereby increasing capacitance ($C_{gd}$) between the gate electrode and the drain electrode. Since influence of small-signal parameters on RF characteristics is relatively low compared to that of capacitance ($C_{gd}$) between the gate electrode and the drain electrode on RF characteristics, description has focused on capacitance ($C_{gd}$).

Thus, there is a need to develop a power semiconductor having excellent DC characteristics and excellent RF characteristics.

SUMMARY

Embodiments provide a power semiconductor device.

In one embodiment, a power semiconductor device includes a substrate, a first semiconductor layer disposed on the substrate, a second semiconductor layer disposed on the first semiconductor layer, a third semiconductor layer disposed on the second semiconductor layer and exposing a portion of the second semiconductor layer, a gate electrode disposed on the portion of the second semiconductor layer exposed via the third semiconductor layer, and a source electrode and a drain electrode disposed on the third semiconductor layer at both sides of the gate electrode to be spaced apart from each other. An electrical segregation region is formed in the third semiconductor layer between the gate electrode and the drain electrode.

The electrical segregation region may be disposed adjacent to the drain electrode.

The gate electrode may contact the second semiconductor layer.

The electrical segregation region may be formed in the third semiconductor layer extending to a portion of the second semiconductor layer.

A channel layer may be disposed at an interface of the first semiconductor layer contacting the second semiconductor layer, and the electrical segregation region may be spaced apart from the channel layer.

A width of the portion of the second semiconductor layer exposed through the third semiconductor layer may correspond to a length of the gate electrode.

A portion of the gate electrode connected to the second semiconductor layer may have a smaller width than that the opposite portion of the gate electrode.

The second semiconductor layer may have a recess portion, and the gate electrode may be disposed on the recess portion.

The recess portion may correspond to the portion of the second semiconductor layer exposed via the third semiconductor layer.

A passivation layer may be disposed on the third semiconductor layer.

An ion implanted into the electrical segregation region may have a different conductivity type than the conductivity type of the third semiconductor layer.

A thickness of the electrical segregation region disposed in the second semiconductor layer may be less than a thickness of the entire second semiconductor layer.

The electrical segregation region may include at least one of Mg, Zn, Ca, Sr, Ba, Fe, or Ar.

In another embodiment, a power semiconductor device includes a source electrode, a drain electrode, and a gate electrode disposed between the source electrode and the drain electrode, a third semiconductor layer disposed under the source electrode and the drain electrode and having an open region with a width corresponding to a length of the gate electrode, a second semiconductor layer disposed under the third semiconductor layer and connected to the gate electrode through the open region, and a first semiconductor layer disposed under the second semiconductor layer. The third semiconductor layer includes a first region disposed adjacent to the gate electrode, a second region disposed adjacent to the drain electrode, and a third region disposed between the first region and the second region, and the third region electrically separates the first region from the second region.

The third region may be an electrical segregation region into which an ion having a different conductivity type from the conductivity type of the third semiconductor layer is implanted.

The third region may be disposed adjacent to the drain electrode.

The power semiconductor device may further include a substrate disposed under the first semiconductor layer, and a transition layer disposed between the substrate and the first semiconductor layer.

The third region may include at least one of Mg, Zn, Ca, Sr, Ba, Fe, or Ar.

The second semiconductor layer may have a recess portion, and the gate electrode may be disposed on the recess portion.

In another embodiment, a power semiconductor device includes a substrate, a first semiconductor layer disposed on the substrate, a second semiconductor layer disposed on the first semiconductor layer, a third semiconductor layer disposed on the second semiconductor layer and exposing a portion of the second semiconductor layer, a gate electrode disposed on the portion of the second semiconductor layer exposed via the third semiconductor layer, and a source electrode and a drain electrode disposed on the third semiconductor layer at both sides of the gate electrode to be spaced apart from each other. A portion of the third semiconductor layer adjacent to the gate electrode is electrically separated from another portion of the third semiconductor layer adjacent to the drain electrode between the gate electrode and the drain electrode.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
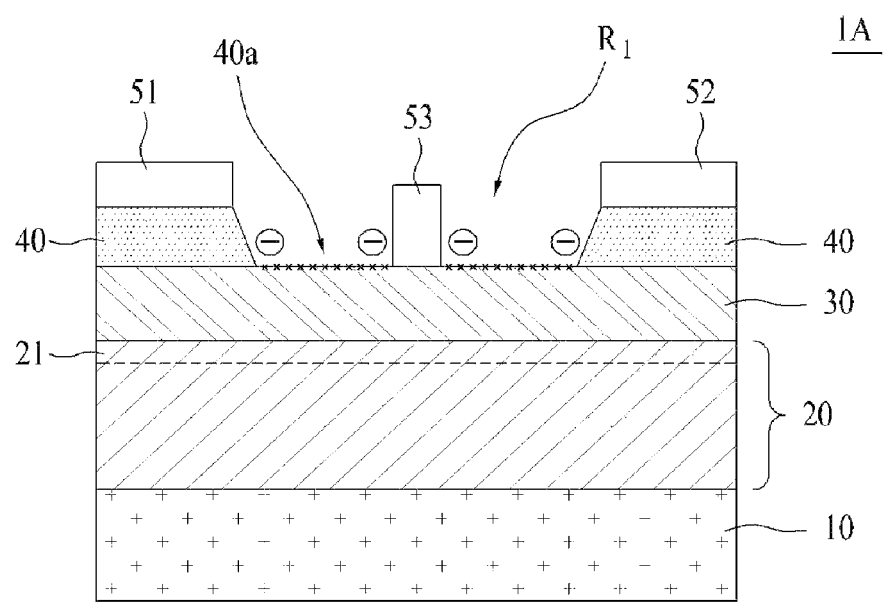
FIG. 1 is a side view, in section, schematically illustrating a conventional high electron mobility transistor (HEMT) device having a first gate-recess structure with a wide recess region where a gate electrode is disposed.

Hereinafter, embodiments will be described with reference to the annexed drawings. Various other modified embodiments of the present disclosure may be provided and the scope of the present disclosure should not be limited to the embodiment that will be described hereinafter in detail. The embodiment of the present disclosure is given to more completely explain the present disclosure to those skilled in the art.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

Figure 3:
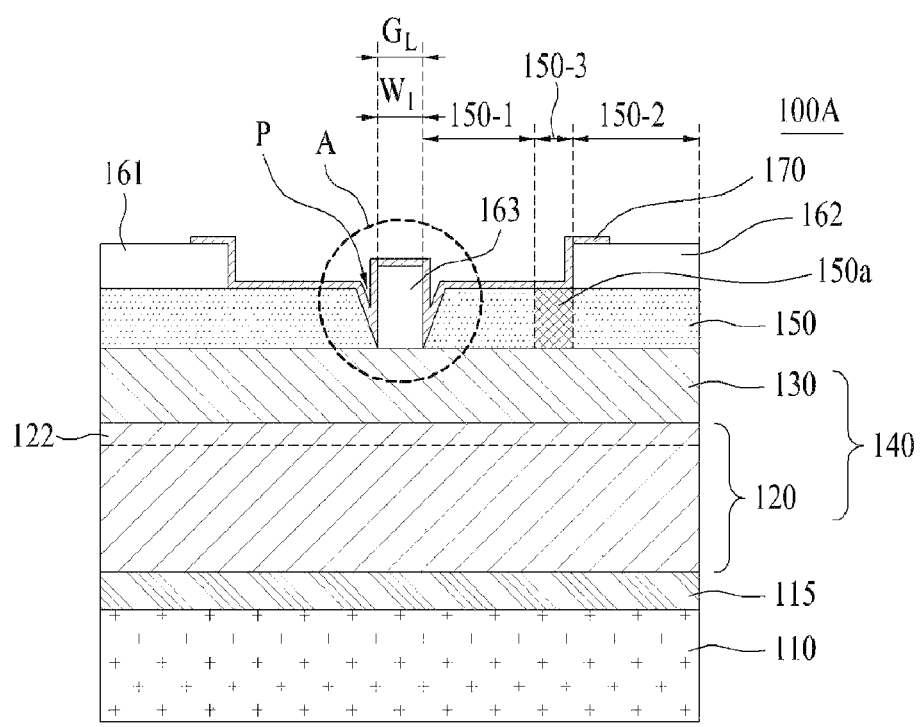
FIG. 3 is a side view, in section, illustrating a power semiconductor device according to an embodiment of the present disclosure.

FIG. 3 is a side view, in section, illustrating a power semiconductor device 100A according to an embodiment of the present disclosure.

Referring to FIG. 3, the power semiconductor device 100A includes a substrate 110, a first semiconductor layer 120, a second semiconductor layer 130, a third semiconductor layer 150, a source electrode 161, a drain electrode 162, and a gate electrode 163.

The substrate 110 may be a sapphire substrate ($Al_2O_3$), a silicon substrate (Si), a silicon carbide substrate (SiC), a gallium nitride substrate (GaN) or a gallium arsenide substrate (GaAs), but is not limited thereto.

A heterojunction structure 140 including the first semiconductor layer 120 and the second semiconductor layer 130 is formed on the substrate 110.

Before growing the first semiconductor layer 120 on the substrate 110, a transition layer 115 may be grown in order to reduce lattice constant difference between materials used to form the substrate 110 and the first semiconductor layer 120. The transition layer 115 may have a single-layer structure such as AlN and AlGaN, or a multi-layer structure such as AlN/AlGaN, AlN/GaN, and AlGaN/AlGaN, but is not limited thereto. In addition, the transition layer 115 may have a multi-layer structure of AlGaN in which the content of Al is varied. For example, in order to reduce lattice constant difference between the substrate 110 and the first semiconductor layer 120, the transition layer 115 may include Al, the amount of which decreases toward the first semiconductor layer 120, but is not limited thereto.

The heterojunction structure 140 including the first semiconductor layer 120 and the second semiconductor layer 130 is grown on the transition layer 115.

The first semiconductor layer 120 and the second semiconductor layer 130 are formed of materials having different polarizabilities and energy band gaps. The first semiconductor layer 120 may have smaller polarizability and energy band gap than those of the second semiconductor layer 130.

The first semiconductor layer 120 may be an undoped or doped semiconductor layer, and may include, for example, at least one selected from the group consisting of GaN, InN, AlN, InGaN, AlGaN, InAlGaN, AlInN, GaAs, AlGaAs, InGaAs, AlInGaAs, GaP, AlGaP, InGaP, AlInGaP, and InP.

The second semiconductor layer 130 may be an undoped or doped semiconductor layer, and may include, for example, at least one selected from the group consisting of GaN, InN, AlN, InGaN, AlGaN, InAlGaN, AlInN, GaAs, AlGaAs, InGaAs, AlInGaAs, GaP, AlGaP, InGaP, AlInGaP, and InP.

An energy band discontinuity occurs at a junction interface between the first semiconductor layer 120 and the second semiconductor layer 130 due to the energy band gap difference between the first semiconductor layer 120 and the second semiconductor layer 130, and polarization occurs due to lattice constant difference between the first semiconductor layer 120 and the second semiconductor layer 130. Thus, a 2-dimensional electron gas (2-DEG) layer is formed. The 2-DEG layer may be formed at an interface of the first semiconductor layer 120 contacting the second semiconductor layer 130 and may function as a channel layer 122. The 2-DEG layer may also be formed in the first semiconductor layer 120 extending from the interface of the first semiconductor layer 120 contacting the second semiconductor layer 130.

The third semiconductor layer 150 is disposed on the second semiconductor layer 130.

The third semiconductor layer 150 is formed for providing a good ohmic contact between the source electrode 161 and the drain electrode 162 disposed thereon and may be formed of an n-type semiconductor by doping. The third semiconductor layer 150 may include GaAs or GaN doped at a high concentration.

The third semiconductor layer 150 has an open region P that partially exposes the second semiconductor layer 130. The gate electrode 163 is disposed on the second semiconductor layer 130 via the open region P. The source electrode 161 and the drain electrode 162 are disposed on non-open regions of the third semiconductor layer 150 at both sides of the gate electrode 163 to be spaced apart from each other. The gate electrode 163 may contact the second semiconductor layer 130.

The third semiconductor layer 150 illustrated in FIG. 3 has inclined side walls that form the open region P. However, the side walls may be vertical walls or inclined walls according to an etching method used to form the open region P, but are not limited thereto.

The source electrode 161 and the drain electrode 162 make ohmic contact with each other and may have a single-layer or multi-layer structure including at least one selected from the group consisting of aluminum (Al), titanium (Ti), chromium (Cr), nickel (Ni), copper (Cu), and gold (Au), but are not limited thereto. In order to improve ohmic contact characteristics between the source electrode 161 and the drain electrode 162, portions of the second semiconductor layer 130 and the first semiconductor layer 120 disposed under the source electrode 161 and the drain electrode 162 may be doped at high concentrations.

The gate electrode 163 makes a Schottky contact and may have a single-layer or multi-layer structure including at least one selected from the group consisting of platinum (Pt), molybdenum (Mo), titanium (Ti), gold (Au), palladium (Pd), tungsten (W), nickel (Ni), iridium (Ir), and osmium (Os), but is not limited thereto.

The gate electrode 163 is structurally connected to the second semiconductor layer 130 via the open region P of the third semiconductor layer 150.

A width $W_1$ of the open region P may correspond to a length $G_L$ of the gate electrode 163 (gate length). That is, the width of the exposed portion of the second semiconductor layer 130 by the third semiconductor layer 150 may correspond to the length $G_L$ of the gate electrode 163 (gate length). Referring to FIG. 3, the width $W_1$ of the open region P is the same as the length $G_L$ of the gate electrode 163. However, the width $W_1$ of the open region P may be greater than the length $G_L$ of the gate electrode 163 to secure a process margin.

The upper surface of the second semiconductor layer 130, except for the portion exposed through the open region P, is covered with the third semiconductor layer 150. The exposed portion of the upper surface of the second semiconductor layer 130 through the open region P may be covered with the gate electrode 163.

An electrical segregation region 150a is disposed in the third semiconductor layer 150 between the gate electrode 163 and the drain electrode 162. According to an embodiment, the electrical segregation region 150a may be an ion implantation region formed through ion implantation.

FIG. 3 illustrates that one side of the electrical segregation region 150a is disposed at the same line as one edge of the drain electrode 162 close to the gate electrode 163. However, the electrical segregation region 150a may also be disposed between the gate electrode 163 and the drain electrode 162 to be close to the drain electrode 162.

The electrical segregation region 150a electrically separates a portion of the third semiconductor layer 150 disposed between the gate electrode 163 and the electrical segregation region 150a from another portion of the third semiconductor layer 150 disposed between the electrical segregation region 150a and the drain electrode 162.

In other words, the third semiconductor layer 150 includes a first region 150-1 disposed adjacent to the gate electrode 163, a second region 150-2 disposed adjacent to the drain electrode 162, and a third region 150-3 disposed between the first region 150-1 and the second region 150-2. The third region 150-3 electrically separates the first region 150-1 from the second region 150-2.

The third region 150-3 of the third semiconductor layer 150 is the electrical segregation region 150a. According to an embodiment, the electrical segregation region 150a may be ion implantation region formed through ion implantation.

The ion implanted into the electrical segregation region 150a may be an ion having different conductivity type than the third semiconductor layer 150. Since the third semiconductor layer 150 includes a first conductivity type ion, the electrical segregation region 150a may include a second conductivity type ion. For example, when the third semiconductor layer 150 includes an n-type ion, a p-type dopant may be implanted into the electrical segregation region 150a to electrically open the third semiconductor layer 150. For example, at least one of Mg, Zn, Ca, Sr, Ba, and the like may be implanted. Alternatively, a dopant such as Fe, Mg, and Ar may be implanted into the electrical segregation region 150a to destroy crystallinity of the third semiconductor layer 150, thereby electrically opening the third semiconductor layer 150.

The first region 150-1, the third region 150-3, and the second region 150-2 of the third semiconductor layer 150 are sequentially aligned from the gate electrode 163 side to the drain electrode 162 side.

One side of the third region 150-3 may be disposed at the same line as one edge of the drain electrode 162 close to the gate electrode 163. In this regard, the second region 150-2 may be disposed to correspond to the width of the drain electrode 162.

Figure 2:
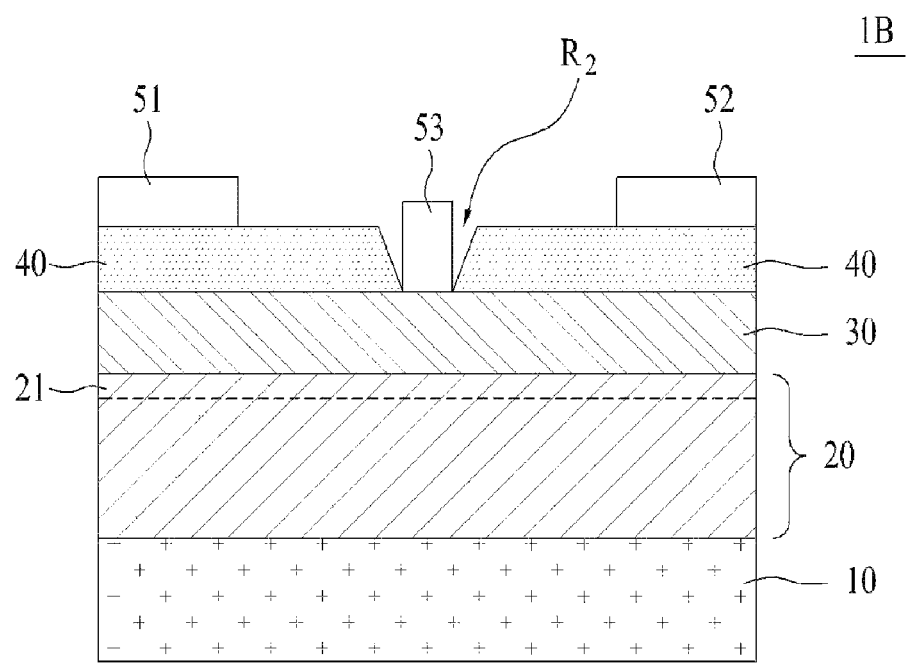
FIG. 2 is a side view, in section, schematically illustrating a conventional HEMT device having a second gate-recess structure with a narrow recess region where a gate electrode is disposed.

According to an embodiment, since the second semiconductor layer 130 is covered with the third semiconductor layer 150 except for the open region P where the gate electrode 163 is disposed, excellent DC characteristics may be obtained in a similar manner to the structure described above with reference to FIG. 2. In addition, by forming the electrical segregation region 150a in the third semiconductor layer 150 between the gate electrode 163 and the drain electrode 162, a substantial distance between the gate electrode 163 and the drain electrode 162 increases, and thus capacitance between the gate electrode 163 and the drain electrode 162 decreases. Thus, the power semiconductor device shown in FIG. 3 may simultaneously have excellent DC characteristics and excellent RF characteristics compared with that shown in FIG. 2. As the electrical segregation region 150a is closer to the drain electrode 162, the substantial distance between the gate electrode 163 and the drain electrode 162 increases. Accordingly, RF characteristics may be further improved.

The thickness of the electrical segregation region 150a contained in the third semiconductor layer 150 may be the same as the thickness of the entire third semiconductor layer 150.

A passivation layer 170 may be formed on the third semiconductor layer 150. The passivation layer 170 protects the device from physical impact or chemical contamination and may be formed of silicon nitride or silicon oxide.

Portions of the source electrode 161 and the drain electrode 170 which are not covered with the passivation layer 170 may be respectively connected to ground and an external power source. Although not shown herein, a gate pad (not shown) connected to the gate electrode 163 may be connected to an external power source.

Figure 4:
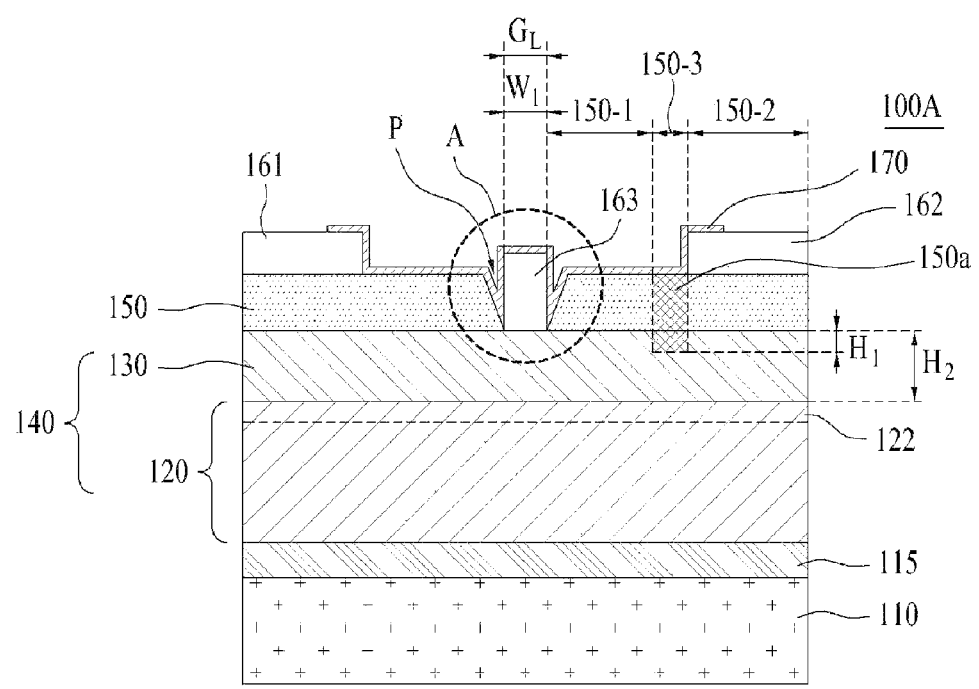
FIG. 4 is a side view, in section, illustrating a power semiconductor device according to another embodiment of the present disclosure.

FIG. 4 is a side view, in section, illustrating a power semiconductor device 100B according to another embodiment of the present disclosure. A detailed description of the constituent elements identical to those of the previous embodiment will not be given, and only different constituent elements will be described.

Referring to FIG. 4, the power semiconductor device 100B includes a substrate 110, a first semiconductor layer 120, a second semiconductor layer 130, a third semiconductor layer 150, a source electrode 161, a drain electrode 162, and a gate electrode 163.

An energy band discontinuity occurs at a junction interface between the first semiconductor layer 120 and the second semiconductor layer 130 due to the energy band gap difference between the first semiconductor layer 120 and the second semiconductor layer 130, and polarization occurs due to lattice constant difference between the first semiconductor layer 120 and the second semiconductor layer 130. Thus, a 2-dimensional electron gas (2-DEG) layer is formed. The 2-DEG layer may be formed at an interface of the first semiconductor layer 120 contacting the second semiconductor layer 130 and may function as a channel layer 122.

The third semiconductor layer 150 includes an open region P that exposes a portion of the second semiconductor layer 130. The gate electrode 163 is disposed on the second semiconductor layer 130 via the open region P. The source electrode 161 and the drain electrode 162 are disposed on non-open regions of the third semiconductor layer 150 at both sides of the gate electrode 163 to be spaced apart from each other.

The gate electrode 163 is structurally connected to the second semiconductor layer 130 via the open region P of the third semiconductor layer 150.

The width $W_1$ of the open region P may correspond to the length $G_L$ of the gate electrode 163 (gate length). That is, the width of the exposed portion of the second semiconductor layer 130 by the third semiconductor layer 150 may correspond to the length $G_L$ of the gate electrode 163 (gate length). Referring to FIG. 4, the width $W_1$ of the open region P is the same as the length $G_L$ of the gate electrode 163. However, the width $W_1$ of the open region P may be greater than the length $G_L$ of the gate electrode 163 to secure a process margin.

An electrical segregation region 150a is disposed in the third semiconductor layer 150 between the gate electrode 163 and the drain electrode 162. According to an embodiment, the electrical segregation region 150a may be an ion implantation region formed through ion implantation. The electrical segregation region 150a may be disposed between the gate electrode 163 and the drain electrode 162 to be close to the drain electrode 162.

The electrical segregation region 150a electrically separates a portion of the third semiconductor layer 150 disposed between the gate electrode 163 and the electrical segregation region 150a from another portion of the third semiconductor layer 150 disposed between the electrical segregation region 150a and the drain electrode 162.

In other words, the third semiconductor layer 150 includes a first region 150-1 disposed adjacent to the gate electrode 163, a second region disposed 150-2 adjacent to the drain electrode 162, and a third region 150-3 disposed between the first region 150-1 and the second region 150-2. The third region 150-3 electrically separates the first region 150-1 from the second region 150-2.

The third region 150-3 of the third semiconductor layer 150 is the electrical segregation region 150a. According to an embodiment, the electrical segregation region 150a may be an ion implantation region formed through ion implantation.

Since the third semiconductor layer 150 includes a first conductivity type ion, the electrical segregation region 150a may include a second conductivity type ion. For example, when the third semiconductor layer 150 includes an n-type ion, a p-type dopant may be implanted into the electrical segregation region 150a to electrically open the third semiconductor layer 150. For example, at least one of Mg, Zn, Ca, Sr, Ba, and the like may be implanted. Alternatively, a dopant such as Fe, Mg, and Ar may be implanted into the electrical segregation region 150a to destroy crystallinity of the third semiconductor layer 150, thereby electrically opening the third semiconductor layer 150.

The first region 150-1, the third region 150-3, and the second region 150-2 of the third semiconductor layer 150 are sequentially aligned from the gate electrode 163 side to the drain electrode 162 side.

One side of the third region 150-3 may be disposed at the same line as one edge of the drain electrode 162 close to the gate electrode 163. In this regard, the second region 150-2 may be disposed to correspond to the width of the drain electrode 162.

The thickness of the electrical segregation region 150a contained in the third semiconductor layer 150 may be the same as the thickness of the entire third semiconductor layer 150.

The electrical segregation region 150a may be formed in the third semiconductor layer 150 extending to a portion of the second semiconductor layer 130.

Since the electrical segregation region 150a should not affect the channel layer 122, the electrical segregation region 150a is spaced apart from the channel layer 122 by a predetermined distance such that at least one portion of the second semiconductor layer 130 is interposed therebetween. That is, the channel layer 122 is disposed on the interface of the first semiconductor layer 120 contacting the second semiconductor layer 130, and the electrical segregation region 150a is spaced apart from the channel layer 122. Thus, a thickness $H_1$ of a portion of the electrical segregation region 150a that is extended to a portion of the second semiconductor layer 130 is less than a thickness $H_2$ of the second semiconductor layer 130. To secure reliability, the electrical segregation region 150a may be extended into the second semiconductor layer 130 up to 70% of the thickness $H_2$ of the second semiconductor layer 130.

The extended portion of the electrical segregation region 150a extended to a portion of the second semiconductor layer 130 may function as a lightly doped drain (LDD) region.

Figure 5:
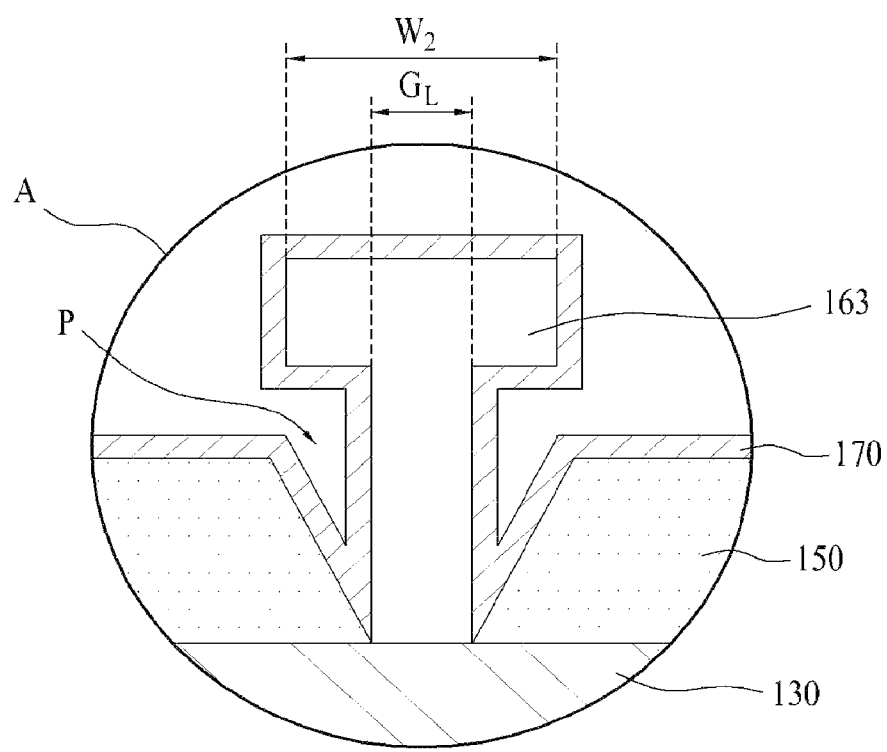
FIGS. 5 to 7 are partially enlarged views illustrating section A of FIG. 3 or 4.
Figure 6:
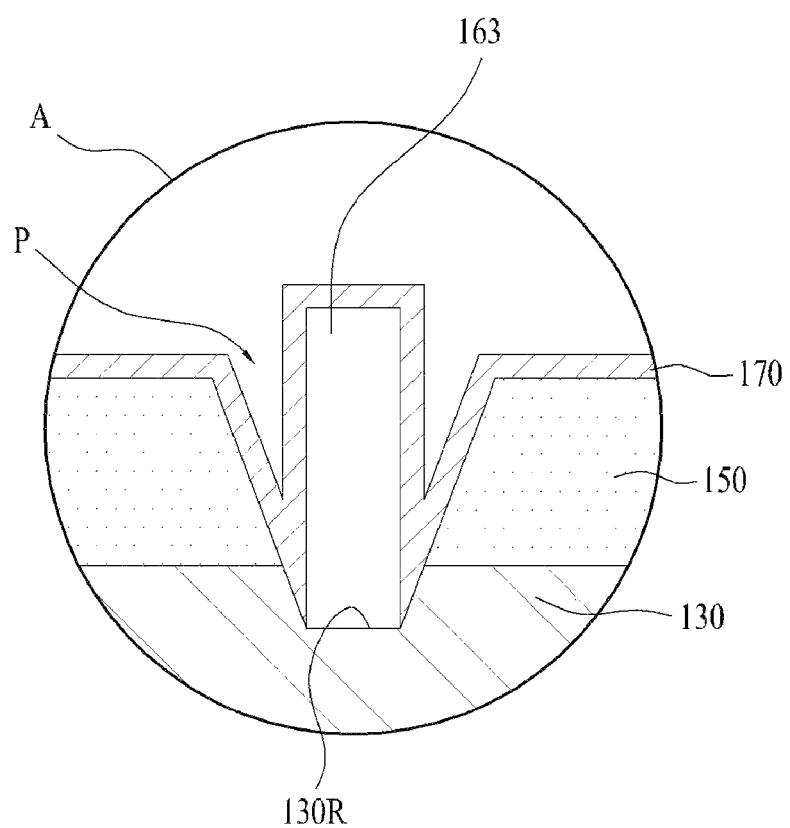
Figure 7:
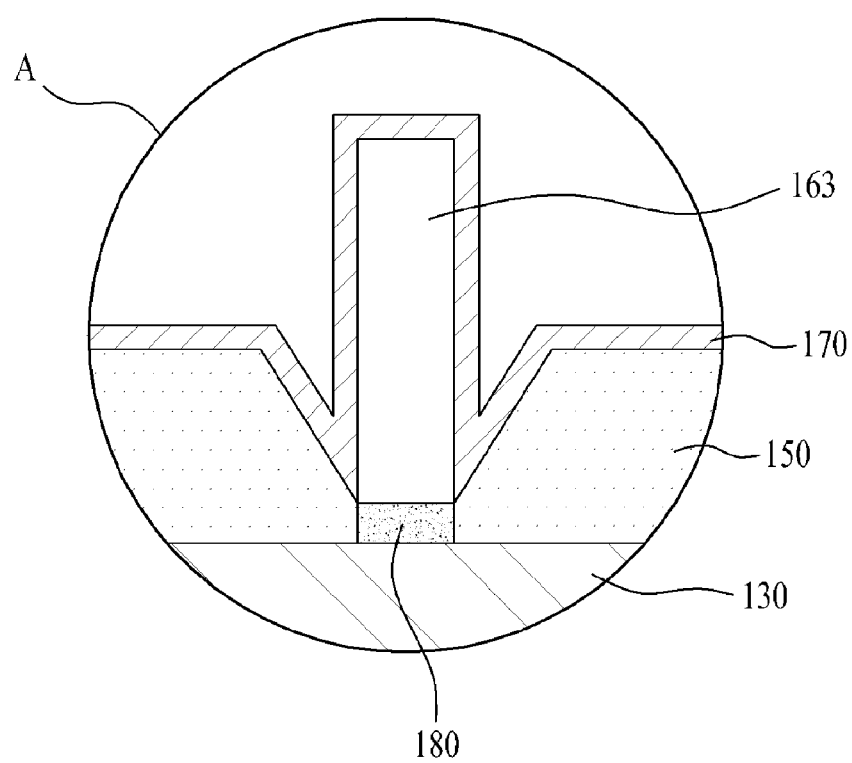

FIGS. 5 to 7 are partially enlarged views illustrating section A of FIG. 3 or 4.

First, referring to FIG. 5, in the gate electrode 163, a width of a portion connected to the second semiconductor layer 130, i.e., the gate length $G_L$, may be smaller than a width $W_2$ of the opposite portion not connected to the second semiconductor layer 130. For example, the gate electrode 163 may be a T-shaped gate electrode or mushroom-shaped gate electrode.

In high-speed semiconductor devices, as a gate length decreases, modulation characteristics are improved. However, decrease in the gate length causes reduction in the cross sectional area of a gate electrode, thereby increasing resistance $R_g$ of the gate electrode. Thus, when a T-shaped gate electrode or mushroom-shaped gate electrode is used, the gate length may decrease and cross-sectional area increases, reducing resistance $R_g$.

In FIG. 5, the T-shaped gate electrode 163 is exemplarily illustrated. However, any other structures may also be applied to the gate electrode as long as the gate electrode has a short gate length $G_L$ and a wide cross-sectional area.

Referring to FIG. 6, the second semiconductor layer 130 has a recess portion 130R, and the gate electrode 163 may be disposed on the recess portion 130R.

The recess portion 130R is recessed from the surface of the second semiconductor layer 130 contacting the third semiconductor layer 150 toward the first semiconductor layer 120 to correspond to the open region P of the third semiconductor layer 150. That is, the recess portion 130R may be formed to correspond to the portion of the second semiconductor layer 130 exposed by the third semiconductor layer 150.

A thickness of a portion of the second semiconductor layer 130 in which the recess portion 130R is formed is less than a thickness of the other portion of the second semiconductor layer 130. The thickness of the second semiconductor layer 130 is a very important factor in determining operation mode or controlling pinch-off voltage. Thus, characteristics of the device may be adjusted by controlling the thickness of the second semiconductor layer 130 by the depth of the recess portion 130R. In general, since an HEMT operates in a depletion mode, a power semiconductor device that operates in an enhancement mode may be manufactured by controlling a threshold voltage by forming the recess portion 130R.

Referring to FIG. 7, a gate insulating layer 180 may be disposed between the gate electrode 163 and the second semiconductor layer 130. The gate insulating layer 180 may also be applied to the structures illustrated in FIG. 5 or 6. A width of the gate insulating layer 180 may correspond to a length of the gate electrode 163.

Figure 8:
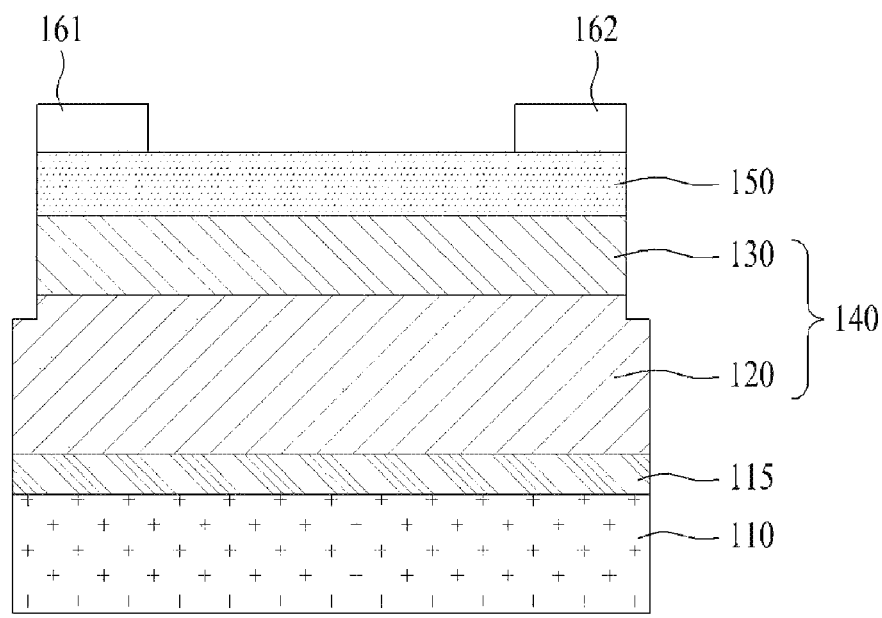
FIGS. 8 to 10 are views for describing a method of manufacturing a power semiconductor device according to embodiments of the present disclosure.
Figure 9:
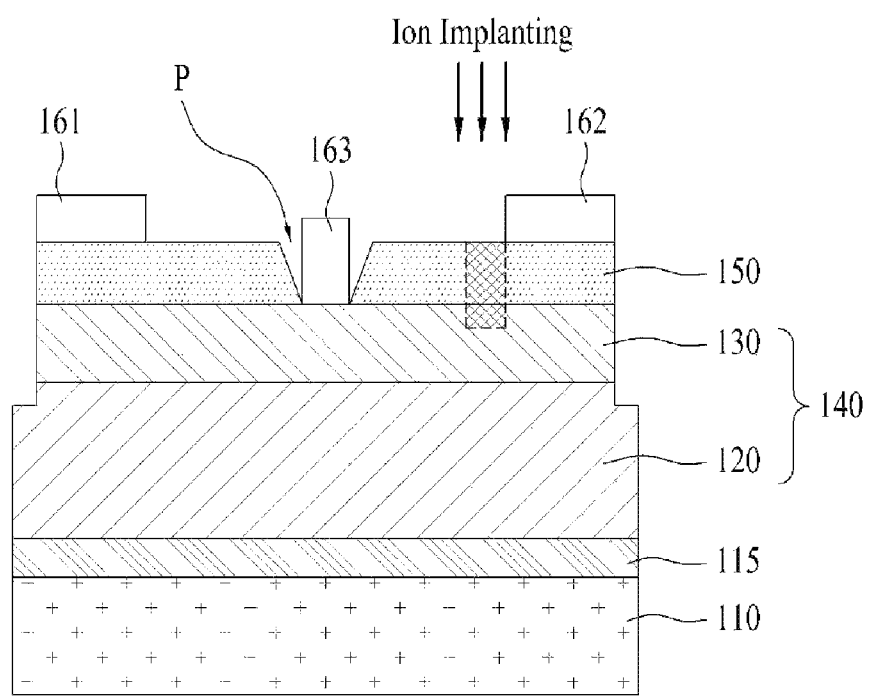
Figure 10:
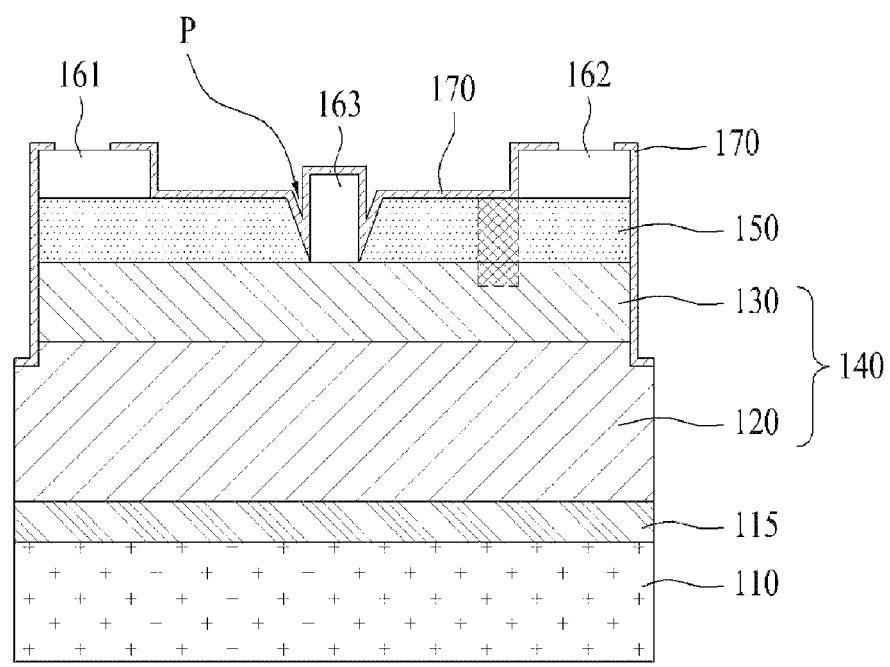

FIGS. 8 to 10 are views for describing a method of manufacturing a power semiconductor device according to the above-described embodiments of the present disclosure. Hereinafter, a method of manufacturing a power semiconductor device will be described with reference to FIGS. 8 to 10.

First, referring to FIG. 8, the transition layer 115 for reducing lattice constant mismatch is grown on the substrate 110. Then, the heterojunction structure 140 including the first semiconductor layer 120 and the second semiconductor layer 130 and the third semiconductor layer 150 are grown thereon.

The transition layer 115, the first semiconductor layer 120, the second semiconductor layer 130, and the third semiconductor layer 150 may be grown by metal organic chemical vapor deposition (MOCVD), molecular beam epitaxy (MBE), vapor phase epitaxy (VPE), or the like, but the growing method is not limited thereto.

In addition, a mesa etching process is performed to electrically separate adjacent power semiconductor devices from each other. Although mesa etched portions are not illustrated in FIGS. 3 and 4 for simplicity, the second semiconductor layer 130 may have a narrower width than the first semiconductor layer 120. Alternatively, a width of a portion of the first semiconductor layer 120 adjacent to the second semiconductor layer 130 may be less than that of another portion of the first semiconductor layer 120 adjacent to the substrate 110.

The mesa etching process may be performed by wet etching or dry etching. In a GaN-based heterojunction structure, etching rate is low by wet etching due to high binding energy of GaN. Thus, dry etching such as inductively coupled plasma-reactive ion etching (ICP-RIE) and electron cyclotron resonance (ECR) plasma etching may be used.

When the power semiconductor devices are electrically separated by the mesa etching process, the source electrode 161 and the drain electrode 162 are formed on the third semiconductor layer 150. The source electrode 161 and the drain electrode 162 may be formed by photolithography using a photoresist PR and E-beam evaporation, but are not limited thereto.

In addition, referring to FIG. 9, the open region P is formed in the third semiconductor layer 150 by the etching process, and then the gate electrode 163 is formed.

The gate electrode 163 may also be formed by photolithography using a photoresist PR and E-beam evaporation. When, a T-shaped gate pattern is formed, for example, a three-layered photoresist pattern of PMMA/P(MMA-MMA)/PMMA may be used.

When the gate electrode 163 is formed, the electrical segregation region 150a is formed in the third semiconductor layer 150 between the gate electrode 163 and the drain electrode 162.

The electrical segregation region 150a may be formed by forming a mask pattern that exposes the corresponding region and implanting ions in a direction shown by arrows using an ion implantation accelerator. The depth of the electrical segregation region 150a may be adjusted by controlling types of ions and ion implantation energy.

In addition, referring to FIG. 10, the passivation layer 170 is formed on the third semiconductor layer 150 and on sides of the heterojunction structure 140 exposed by the mesa etching, except for portions for connection with ground or an external power source.

However, the method of manufacturing the power semiconductor device described above is an example, and detailed procedures and techniques may be modified in various ways according to embodiments.

According to the above embodiments, the upper surface of the gate electrode 163 is lower than the upper surface of the source electrode 161 or the drain electrode 162. However, the upper surfaces of the gate electrode 163, the source electrode 161, and the drain electrode 162 may be modified in accordance with the manufacturing process or design.

Figure 11:
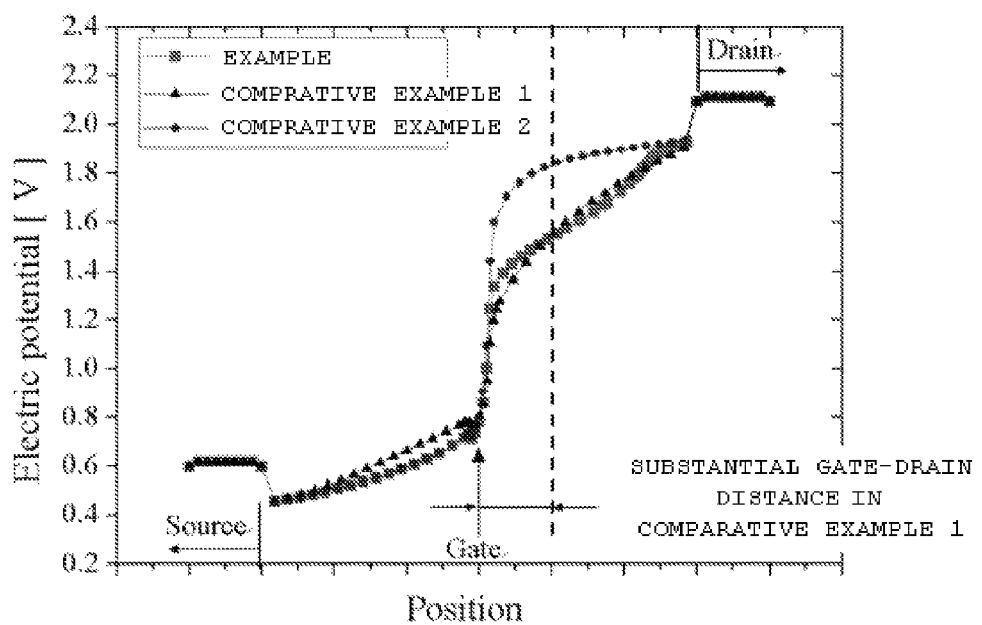
FIG. 11 is a graph for describing RF characteristics of a power semiconductor device according to an embodiment of the present disclosure.

FIG. 11 is a graph for describing RF characteristics of a power semiconductor device according to an embodiment of the present disclosure.

FIG. 11 illustrates electric potentials of power semiconductor devices with respect to position between the source electrode and the drain electrode. In Comparative Example 1, a conventional HEMT device having the first gate-recess structure with a wide recess region described above with reference to FIG. 1 was used. In Comparative Example 2, a conventional HEMT device having the second gate-recess structure with a narrow recess region described above with reference to FIG. 2 was used.

The electric potential of the HEMT device of Comparative Example 1 linearly increases over the entire area between the gate electrode and the drain electrode. On the other hand, the electric potential of the HEMT device of Comparative Example 2 rapidly increases near the gate electrode and is saturated.

An electric field profile as illustrated in Comparative Example 2 reduces a substantial distance between the gate electrode and the drain electrode, thereby increasing capacitance ($C_{gd}$). The increase in capacitance ($C_{gd}$) causes reduction in maximum oscillation frequency ($F_{max}$), thereby deteriorating RF characteristics.

According to an embodiment of the present disclosure, although the third semiconductor layer is formed up to the vicinity of the gate electrode, a substantial distance between the gate electrode and the drain electrode is increased by the electrical segregation region formed between the gate electrode and the drain electrode, thereby reducing capacitance ($C_{gd}$). Thus, advantages of Comparative Example 1 were obtained. As a result, excellent RF characteristics may be obtained.

Figure 12:
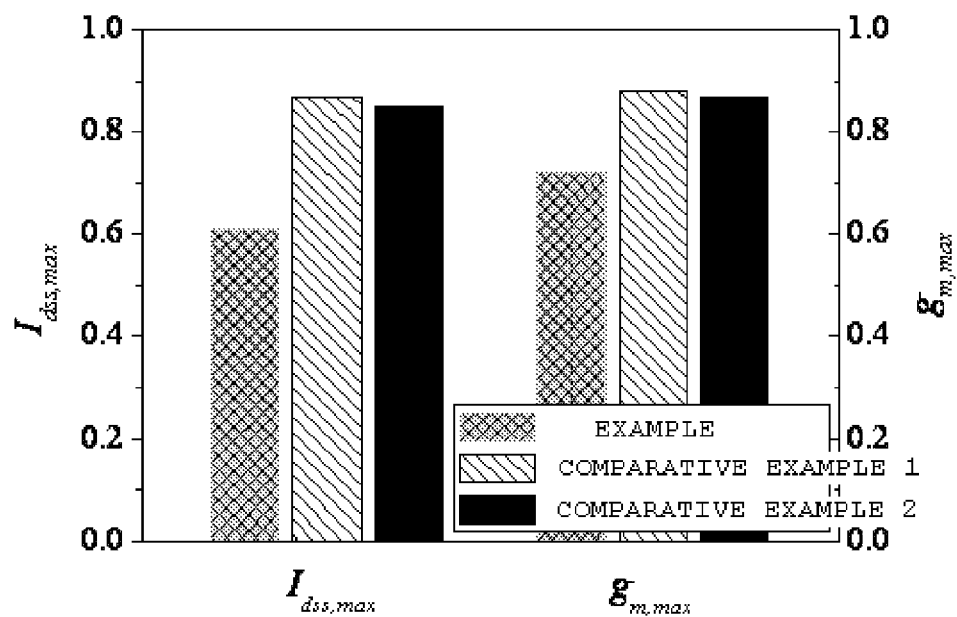
FIG. 12 is a graph illustrating $I_{dss,max}$ and $G_{m,max}$ for describing DC characteristics of a power semiconductor device according to an embodiment of the present disclosure.
Figure 13:
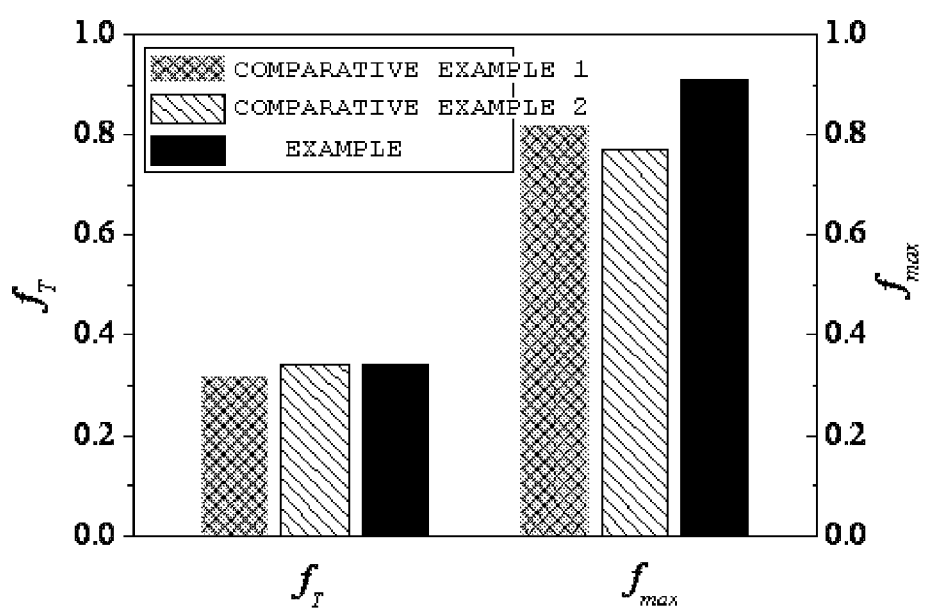
FIG. 13 is a graph illustrating $F_T$ and $F_{max}$ for describing RF characteristics of a power semiconductor device according to an embodiment of the present disclosure.

FIG. 12 is a graph illustrating $I_{dss,max}$ and $G_{m,max}$ for describing DC characteristics of a power semiconductor device according to an embodiment of the present disclosure. FIG. 13 is a graph illustrating $F_T$ and $F_{max}$ for describing RF characteristics of a power semiconductor device according to an embodiment of the present disclosure.

In Comparative Example 1, a conventional HEMT device having the first gate-recess structure with a wide recess region described above with reference to FIG. 1 was used. In Comparative Example 2, a conventional HEMT device having the second gate-recess structure with a narrow recess region described above with reference to FIG. 2 was used.

Referring to FIGS. 12 and 13, since the power semiconductor device according to an embodiment of the present disclosure has high maximum drain current ($I_{dss,max}$) and high maximum transconductance ($G_{m,max}$), it can be seen that advantages of Comparative Example 2 were obtained. As a result, excellent DC characteristics may be obtained. Since the power semiconductor device according to an embodiment of the present disclosure has high cutoff frequency ($F_T$) and high maximum oscillation frequency ($F_{max}$)/it can be seen that advantages of Comparative Example 1 were obtained. As a result, excellent RF characteristics may be obtained. Particularly, referring to FIG. 13, it can be confirmed that RF characteristics were further improved compared with Comparative Example 1.

As is apparent from the above description, a power semiconductor device having excellent DC characteristics and excellent RF characteristics may be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power semiconductor device comprising:
    a substrate;
    a first semiconductor layer on the substrate;
    a second semiconductor layer on the first semiconductor layer;
    a third semiconductor layer on the second semiconductor layer and exposing a portion of the second semiconductor layer;
    a gate electrode on the portion of the second semiconductor layer exposed via the third semiconductor layer; and
    a source electrode and a drain electrode on the third semiconductor layer at both sides of the gate electrode to be spaced apart from each other,
    wherein an electrical segregation region is disposed in the third semiconductor layer between the gate electrode and the drain electrode.

2. The power semiconductor device according to claim 1, wherein the electrical segregation region is adjacent to the drain electrode.

3. The power semiconductor device according to claim 1, wherein the gate electrode contacts the second semiconductor layer.

4. The power semiconductor device according to claim 1, wherein the electrical segregation region is expended from the third semiconductor layer to a portion of the second semiconductor layer.

5. The power semiconductor device according to claim 4, wherein:
    a channel layer is disposed at an interface of the first semiconductor layer contacting the second semiconductor layer; and
    the electrical segregation region is spaced apart from the channel layer.

6. The power semiconductor device according to claim 4, wherein a thickness of the electrical segregation region disposed in the second semiconductor layer is less than a thickness of the entire second semiconductor layer.

7. The power semiconductor device according to claim 1, wherein a width of the portion of the second semiconductor layer exposed through the third semiconductor layer corresponds to a length of the gate electrode.

8. The power semiconductor device according to claim 1, wherein a portion of the gate electrode connected to the second semiconductor layer has a smaller width than that the opposite portion of the gate electrode.

9. The power semiconductor device according to claim 1, wherein:
the second semiconductor layer has a recess portion; and
the gate electrode is disposed on the recess portion.

10. The power semiconductor device according to claim 9, wherein the recess portion corresponds to the portion of the second semiconductor layer exposed via the third semiconductor layer.

11. The power semiconductor device according to claim 1, wherein a passivation layer is disposed on the third semiconductor layer.

12. The power semiconductor device according to claim 1, wherein an ion implanted into the electrical segregation region has a different conductivity type than the conductivity type of the third semiconductor layer.

13. The power semiconductor device according to claim 1, wherein the electrical segregation region comprises at least one of Mg, Zn, Ca, Sr, Ba, Fe, or Ar.

14. A power semiconductor device comprising:
a source electrode, a drain electrode, and a gate electrode between the source electrode and the drain electrode;
a third semiconductor layer disposed under the source electrode and the drain electrode and having an open region with a width corresponding to a length of the gate electrode;
a second semiconductor layer disposed under the third semiconductor layer and connected to the gate electrode through the open region; and
a first semiconductor layer under the second semiconductor layer,
wherein the third semiconductor layer comprises a first region adjacent to the gate electrode, a second region adjacent to the drain electrode, and a third region between the first region and the second region, and the third region electrically separates the first region from the second region.

15. The power semiconductor device according to claim 14, wherein the third region is an electrical segregation region into which an ion having a different conductivity type from the conductivity type of the third semiconductor layer is implanted.

16. The power semiconductor device according to claim 14, wherein the third region is adjacent to the drain electrode.

17. The power semiconductor device according to claim 14, further comprising a substrate under the first semiconductor layer, and a transition layer disposed between the substrate and the first semiconductor layer.

18. The power semiconductor device according to claim 14, wherein the third region comprises at least one of Mg, Zn, Ca, Sr, Ba, Fe, or Ar.

19. The power semiconductor device according to claim 14, wherein:
the second semiconductor layer has a recess portion; and
the gate electrode is disposed on the recess portion.

20. A power semiconductor device comprising:
a substrate;
a first semiconductor layer disposed on the substrate;
a second semiconductor layer disposed on the first semiconductor layer;
a third semiconductor layer disposed on the second semiconductor layer and exposing a portion of the second semiconductor layer;
a gate electrode disposed on the portion of the second semiconductor layer exposed via the third semiconductor layer; and
a source electrode and a drain electrode disposed on the third semiconductor layer at both sides of the gate electrode to be spaced apart from each other,
wherein a portion of the third semiconductor layer adjacent to the gate electrode is electrically separated from another portion of the third semiconductor layer adjacent to the drain electrode between the gate electrode and the drain electrode.

\* \* \* \* \*